United States Patent [19]
Issler

[11] Patent Number: 6,031,498
[45] Date of Patent: Feb. 29, 2000

[54] ANTENNA PATTERN MEASUREMENT METHOD AND DEVICE

[75] Inventor: Jean-Luc Issler, St Orens, France

[73] Assignee: Centre National d'Etudes Spatiales, Paris, France

[21] Appl. No.: 09/043,619

[22] PCT Filed: Sep. 24, 1996

[86] PCT No.: PCT/FR96/01490

§ 371 Date: Aug. 27, 1998

§ 102(e) Date: Aug. 27, 1998

[87] PCT Pub. No.: WO97/12253

PCT Pub. Date: Apr. 3, 1997

[30] Foreign Application Priority Data

Sep. 26, 1995 [FR] France .................................. 95 11256

[51] Int. Cl.[7] ...................................................... G01S 3/02
[52] U.S. Cl. .......................... 343/703; 342/351; 364/455; 370/281; 455/12.1; 455/427
[58] Field of Search ............................. 343/703; 342/351, 342/352; 364/455; 370/281, 319, 203; 455/12.1, 427

[56] References Cited

U.S. PATENT DOCUMENTS 4,684,955   8/1987   Adams, Jr. et al. .................... 342/351

FOREIGN PATENT DOCUMENTS 2655427   6/1991   France .

OTHER PUBLICATIONS

IEEE Antennas and Propagation Society Int. Symp., vol. 4, Jul. 20–24, 1992, Chicago, US, pp. 2060–2063, XP000340085, Ekelman et al.: "On–site station antenna verification".

IEE Proc. A, vol. 127, No. 7, Sep. 1980, Stevenage, pp. 417–433, XP002005327, Keen: "Satellite–antenna measurement techniques".

IEEE 1988 Int. Symp. on Electromagnetic Compatibility, Aug. 2, 1988, Seatle, US, pp. 290–294, XP000015319, Demarinis: "Quality control of antenna calibration".

Lectronics and Communications in Japan, Part I, vol. 70, No. 8, Aug. 1987, New York, US, pp. 119–126, XP000159280, Kondou: "Radiation characteristics of reflector antenna".

Primary Examiner—Don Wong
Assistant Examiner—James Clinger
Attorney, Agent, or Firm—Pearne, Gordon, McCoy & Granger LLP

[57] ABSTRACT

This invention relates to a process for measuring an antenna diagram in which:

- the antenna (30) is connected to a receiver (33) capable of supplying C/No measures (the ratio of the useful signal power to the noise power spectral density) and possibly phase variation measurements;
- the antenna (30) is placed at the end of a mast (32) or a carrier satellite facing towards the sky to track the satellites in a constellation, the antenna reception band being included in the satellite antenna transmission band;
- the C/No ratio and phase variations are automatically recorded for a given period;
- the diagram for the said antenna is deduced by calculation.

10 Claims, 5 Drawing Sheets

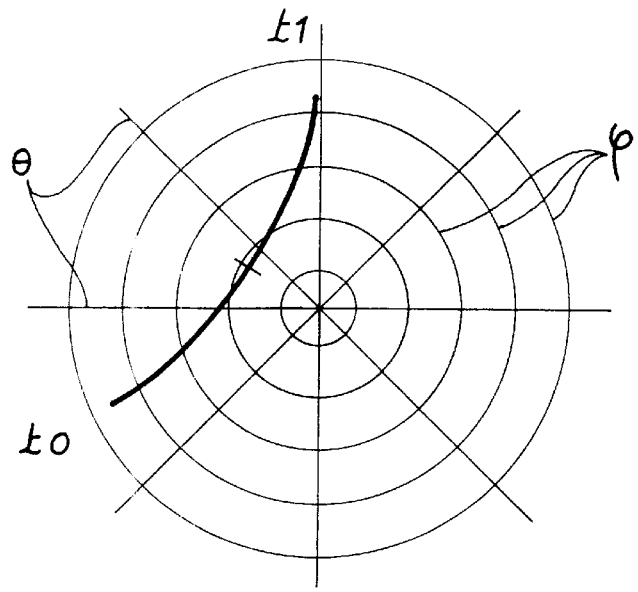
FIG. 8
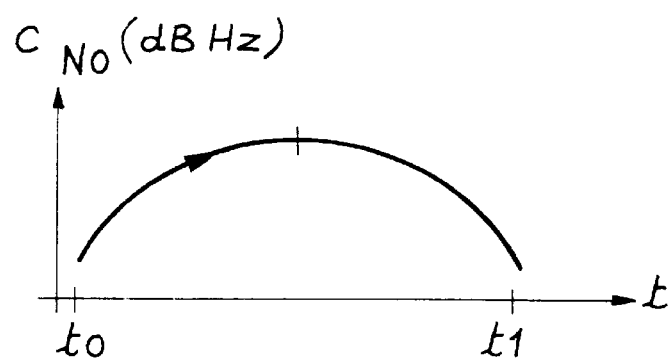
FIG. 9
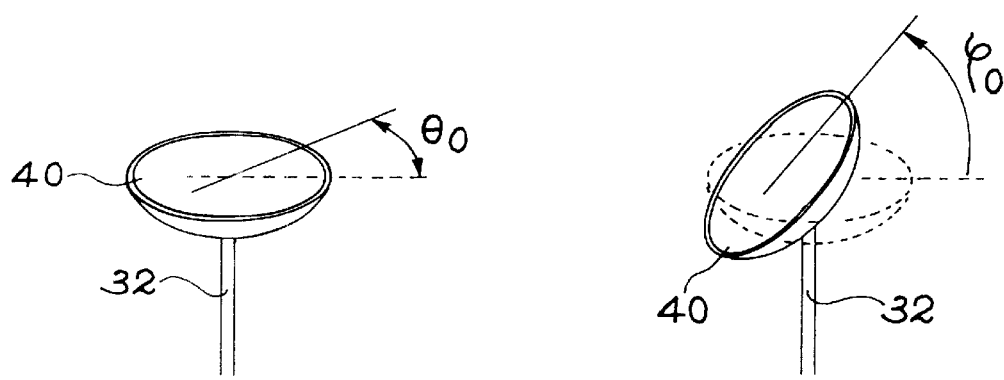
FIG. 11
FIG. 12

ANTENNA PATTERN MEASUREMENT METHOD AND DEVICE

TECHNICAL FIELD

This invention relates to a process and device for measuring an antenna diagram.

STATE OF PRIOR ART

Measurement methods are necessary to characterize antennas in order to:

- use experimental methods to size antennas that cannot be modeled;
- finalize the design of antennas that have already been designed by "approximate" models;
- validate the results of modeling obtained with "exact" software, and use these models when there is a doubt about the physical meaning of some of the calculation results.

The purpose of the measurement equipment is to record the antenna radiation and matching characteristics:

- by reproducing actual usage conditions (for example plane waves in reception) as accurately as possible, by using long external bases (far field) or compact bases (plane wave recreated at short distance in an anechoic chamber);
- by precise readings of the near field (amplitude and phase) on a surface surrounding the antenna and by calculating the radiated far field;
- by impedance measurements (antenna matching) that are obtained using a vectorial network analyzer, preferably in an anechoic chamber or in free space to prevent any coupling of the antenna with the measurement laboratory.

In a measurement base in far field like that shown in FIG. 1, the antenna to be measured 10 is placed in a direction determined with respect to a transmission antenna 11 perfectly calibrated in gain and in emitted power. The antenna to be measured, which may be protected by a radome, is connected to a device 12, for example measuring the power and the phase of the received signal. The distance D between the two antennas must be sufficient so that the waves received by the antenna to be measured are plane waves. A positioner 13 rotates the antenna 10 to be measured in different directions, for example in rotation $\phi$ and in sighting direction $\theta$. The disadvantage of this type of measurement base is that it requires a large site, the size of which depends on the wave length. The length of this site may be several hundred meters.

In a compact base such as that shown in FIG. 2, which may be located inside a building, the waves emitted by an antenna 21 transmitting hemispheric waves are reflected by a reflector 22 that transforms the spherical waves into plane waves that are received by the antenna to be measured 23, which reduces technical effects due to distance. The disadvantage of this type of base is that uses accurate but expensive means, and furthermore which are more difficult to perfect.

In a near field base like that shown in FIG. 3, the signal power and phase in the near field emitted by a source 24 are measured, and antenna theory is applied in detail in order to obtain the characteristics of the antenna to be measured 25, using a measurement device 26. The disadvantage of this type of base is that very accurate and very precise measurement probes and sophisticated computer facilities are necessary.

In the space domain, the satellite localization/navigation sector is developing very quickly. The American G.P.S. (Global Positioning System) is an existing worldwide positioning system using a large number of satellites, that a navigator can use to determine his position and speed. The USSR has developed an equivalent system called GLONASS.

Other telecommunications satellite constellations with land mobile and/or navigation mobiles will be launched in the future, for example:

GLOBALSTAR operating with an S band down link;

IRIDIUM operating in the S band;

ORBCOMM operating in VHF;

STARSYS operating in VHF;

GNSS2 operating in the L band.

References [1] and [2] describe methods of measuring the attitude of a satellite using a GPS antenna.

Reference [3] describes how to use the signal/noise ratio for correction of errors due to multiple paths in GPS differential (or interferometric) phase measurements.

Reference [4] studies the use of GPS receivers and GPS/GLONASS receivers. This article illustrates the fact that this type of receiver is now in widespread use.

References [5] and [6] contain a technical description and characteristics of the global navigation system using the GLONASS-M satellite.

The purpose of this invention is to provide a means of making measurements of antenna diagrams, without the need for expensive measurement systems, making use of the satellites in a given constellation.

DESCRIPTION OF THE INVENTION

This invention proposes a process for measuring an antenna diagram in which:

The antenna is connected to a receiver capable of outputting measurements of the C/No ratio, which is the ratio of the useful signal power to the noise power spectral density. This receiver can also optionally measure the phase variation of the received signal carrier.

The antenna is placed at the top of a mast, or on a carrier satellite facing towards the sky to observe the satellites in a constellation, the antenna reception band containing the transmission band of the satellite antennas used.

The C/No ratios associated with observable satellites are automatically recorded for a given period.

The diagram for the said antenna is determined by calculation.

Advantageously, an antenna gain function can be calculated, making use of a limited number of coefficients. These coefficients are adjusted using measurements based on a least squares criterion.

For example, the antenna gain could be given by the following formula:

$$G_r = \sum_{i=o}^{i=n} f_i(ai, bi, ci, di, ei, \theta, \varphi)$$

$\theta$ and $\phi$ are spherical coordinates; ai, bi, ci, di and ei are coefficients.

For example, the antenna may be in the L, S, C, VHF or UHF band.

For example, the satellite constellation may be of the GPS, GLONASS, GNSS2, GLOBALSTAR, IRIDIUM, ORBCOMM, STARSYS, SATIVOD or TELEDESIC type.

This invention also relates to a device for measuring an antenna diagram, characterized in that it comprises a mast, or a carrier satellite, at the end of which the antenna to be measured is placed, a receiver to receive signals from the antenna and a means for processing signals output from this receiver, and absorbent material placed on or around the mast.

Beneficially, the antenna is placed under a radome if protection is essential against the external media at all times. This is the case particularly if the antenna to be measured is already installed on a satellite or another sensitive carrier structure. A preamplifier calibrated as a noise factor is placed between the antenna and the receiver. The antenna may be placed on an azimuth and elevation positioner.

The process according to the invention has many advantages:

it does not require any special transmission equipment;
it can use low cost commercially available receivers such as GPS, GLONASS, GPS-GLONASS receivers;
the signal power and phase are no longer necessarily measured (which required a measurement of polarization losses), but instead the C/No ratio is measured that includes all losses that occur along the path. Therefore, a global measurement is made;
the diagram of an antenna for the reception of GPS or GLONASS signals (or signals from other constellations) mounted on a satellite already in orbit can be measured.

The equipment means to be used are much lighter in weight and less expensive than equipment necessary for conventional antenna bases (far field base, long base, near field base, compact base).

Antennas to be measured which are not specifically dedicated to reception from a satellite constellation must be relatively wide band.

BRIEF DESCRIPTION OF THE FIGURES

FIGS. 8 and 9 illustrate an example satellite pass and the corresponding C/No measurement curve;

FIGS. 11 and 12 illustrate one characteristic of two alternative embodiments of the device according to the invention.

DETAILED DESCRIPTION OF EMBODIMENTS

The invention can be used to measure an antenna diagram, for example in the L band, using satellites in a constellation and the associated receivers.

For example, the following satellite constellation types can be used:

GPS;
GLONASS.

In this case the frequency bands that can be used are:

for GPS:

L1→about 1575.42 MHz
L2→about 1227.60 MHz for GLONASS: Different L1 and L2 frequencies are possible.

Figure 1:
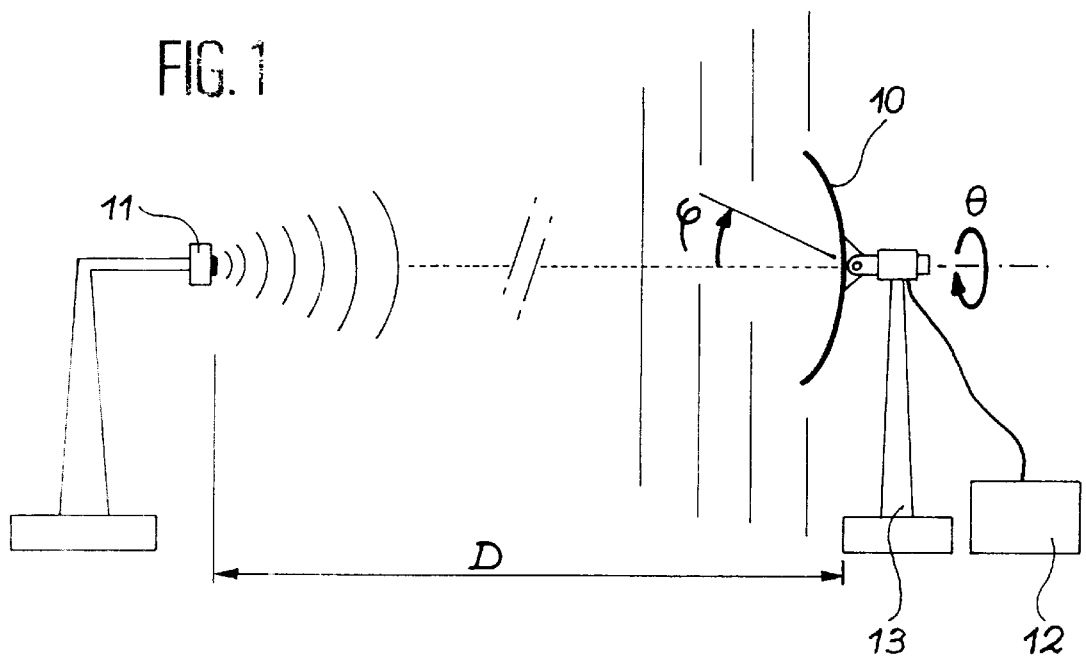
FIGS. 1 to 3 illustrate different devices in prior art.
Figure 2:
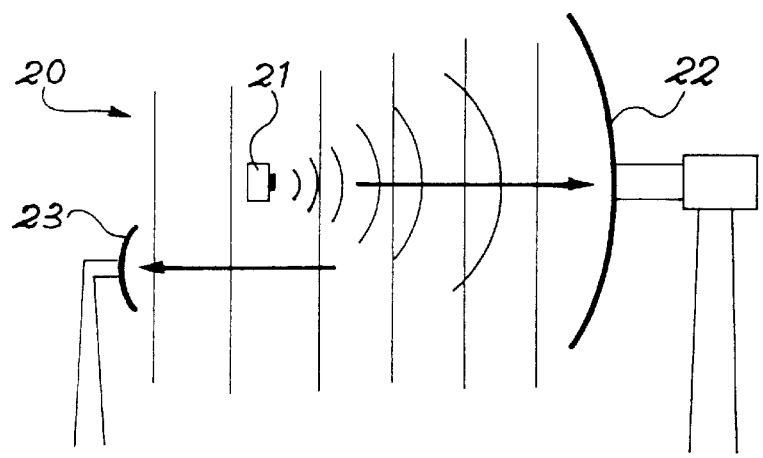
Figure 3:
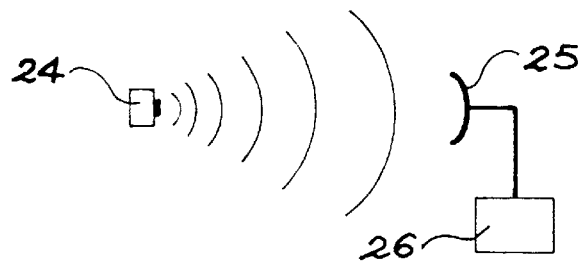
Figure 4:
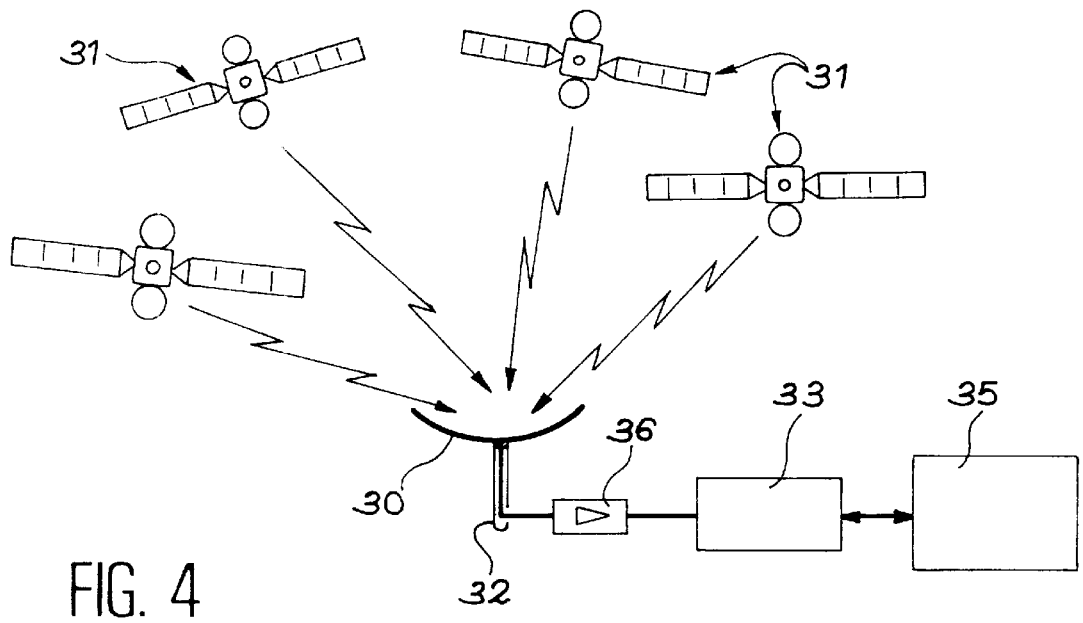
FIGS. 4 and 5 illustrate the device according to the invention.
Figure 5:
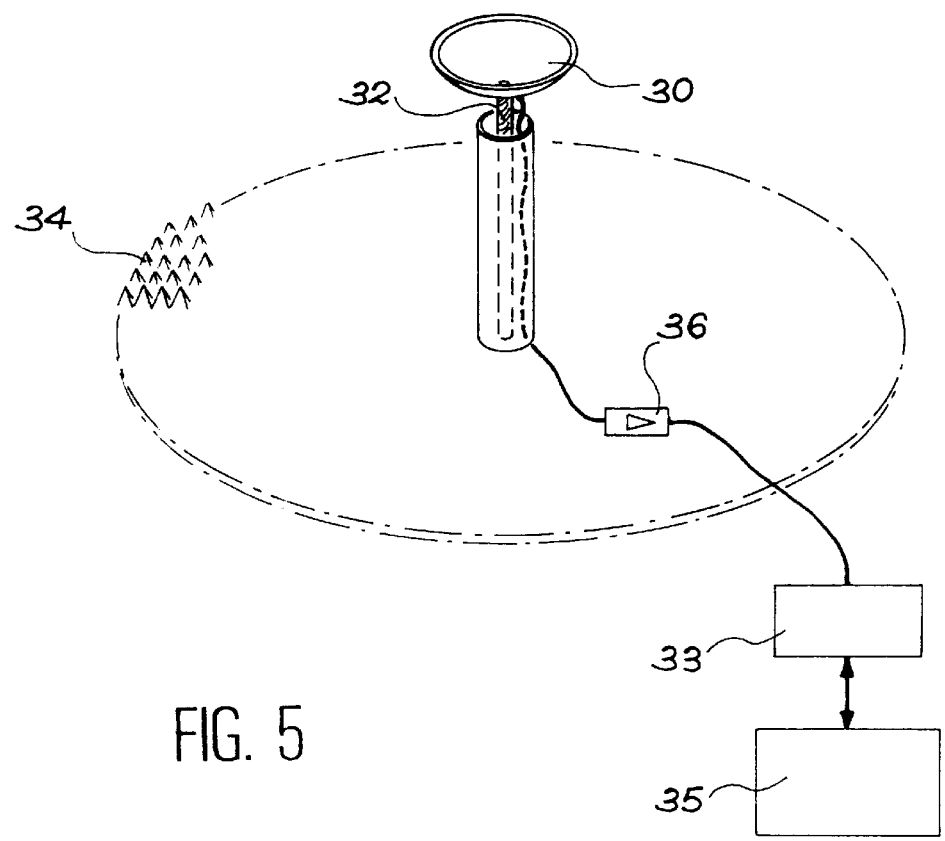

As shown in FIGS. 4 and 5, the invention consists of placing the antenna to be measured facing the sky, towards the various satellites 31 in a constellation. It is placed at the top of a mast 32 (or other support), in a location in which parasite reflections are minimized (no nearby buildings or obstacles, absorbent coating on the ground around the mast). The antenna to be measured is connected to a receiver 33, for example of the GPS or GLONASS or GPS-GLONASS (GNSS) type, possibly through a preamplifier 36 which may be built into the antenna.

The mast 32 is sized to be able to support the antenna 30. This antenna 30 may be of several types. For example, it may be a spiral or a parabola. It may be located under a protective radome.

The mast height must be a few wave lengths. In one example embodiment, the height of this mast is about 1 meter. It thus elevates the antenna above the nearest surfaces.

This mast must be made on a non metallic, dielectric material, for example Teflon (trademark).

Absorbent structures 34 placed on and around this mast may consist of foams containing carbon particles to absorb radio electric signals (for example made by the Emerson and Cumming company).

The receiver may be connected to a computer 35, which records the various data supplied by the equipment:

ephemeris tables for each of the satellites being tracked (optional);
measurements of the C/No ratio made for each of the satellites being tracked;
measures of the phase variation of the received signal carriers (optional).

If the receiver cannot acquire ephemeris tables for the satellites being tracked, it is assumed that they are obtained by the computer 35 connected to a database containing this information.

Figure 6:
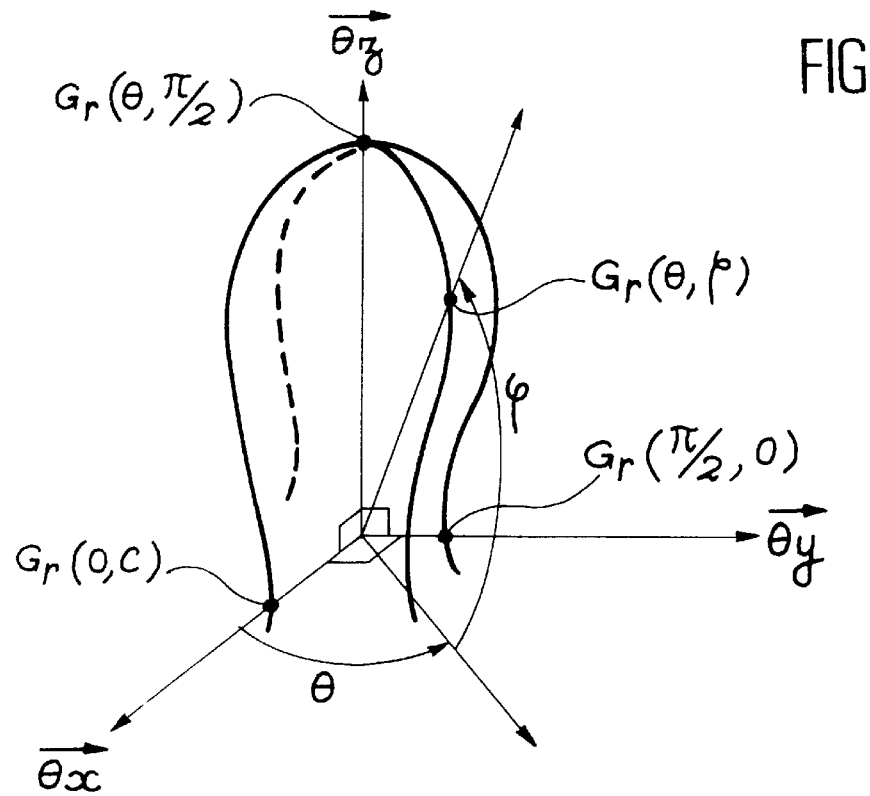
FIG. 6 illustrates the gain curve of the antenna to be measured in terms of spherical coordinates.

The gain Gr of the antenna to be measured is defined as a function of two angles, θ and φ (spherical coordinates). The representation of Gr is shown in FIG. 6.

It may be assumed that the gain of the antenna to be tested can be expressed as a limited series of elementary functions fi of θ and φ, with the coefficients ai, bi, ci, di and ei as parameters.

$$G_r = \sum_{i=o}^{i=n} f_i(ai, bi, ci, di, ei, \theta, \varphi)$$

The gain function Gr is then characterized by (n+1)×5 coefficients, in the case of this example.

The gain of the antenna is determined by estimating the coefficients ai, bi, ci, di and ei using the measurements of the ratio C/No and knowing angles θ and φ representing the sighting angles of the satellites being tracked, the C/No ratio being the ratio between the useful signal power to the noise power spectral density.

The angles θ and φ are known by reference to ephemeris tables:

φ=elevation=function (mast position, ephemeris)
θ=azimuth=function (mast position, ephemeris).

The equation of the link balance is obtained, where C/No is a ratio measured by the receiver $$\left(\frac{C}{No}\right) = G_{ek}(\theta, \varphi) \times P_{ek} \times \frac{c^2}{(4\pi)^2 \times D_k^2 \times f^2} \times \frac{1}{L_{(\theta,\varphi)}} \times G_r(\theta, \varphi) \times \frac{1}{No}$$

where:

K=number of satellite being tracked $P_{ek}$=power transmitted by satellite No. K $G_{ek}$=gain of the satellite No. K transmission antenna $PIRE_k$=associated intrinsic equivalent radiated power $D_k$=distance between the antenna to be tested and satellite No. K C=speed of light f=working frequency for measuring the gain Gr $L_{(\theta, \varphi)}$=various losses (polarization, atmospheric, rain, etc.) where $L_{(\theta, \varphi)} > 0$ $$No = K \cdot T \text{ where } T = \frac{T_{ANT}}{L_{FRX}} + \left(1 - \frac{1}{L_{FRX}}\right) \times T_{RFX} + T_R$$

T=equivalent noise temperature $T_{ANT}$=antenna noise temperature $L_{FRX}$=losses in the feeder $T_{FRX}$=temperature of the feeder $T_R$=receiver noise temperature $T_{ANT}$, $L_{FRX}$, $T_{FRX}$ and $T_R$ are assumed to be known.

When $\theta$ and $\varphi$ are known (using ephemeris tables), then $G_{ek}$, $D_k$ and L are known; f is also known.

The unknown are $P_{ek}$ and ai, bi, ci, di and ei.

In the case of a constellation with 24 satellites, K=1, 2, . . . , 23, 24.

Therefore the unknowns are:

$P_{e1}$, $P_{e2}$, . . . , $P_{e24}$ $a_1, a_2, \ldots, a_n$ $b_1, b_2, \ldots, b_n$ $c_1, c_2, \ldots, c_n$ $d_1, d_2, \ldots, d_n$ $e_1, e_2, \ldots, e_n$ Therefore the unknowns represent the status vector of the gain estimating filter.

The process for estimating the gain will be an optimization process, therefore using the link balance as a model, and possibly using one of the following constraints given as an example:

*Continuity Constraint $G_r(\theta, \varphi) - G_r(\theta+\Delta\theta, \varphi+\Delta\varphi) \leq \Delta Gr (\Delta\theta, \Delta\varphi)$ $\Delta\theta$ and $\Delta\varphi$ are angular variation values $\Delta G_r$=maximum tolerable gain variation for the angular variations $\Delta\theta$ and $\Delta\varphi$.

*Symmetry of Revolution Constraint $G_r(\theta_1, \varphi) = G_r(\theta_2, \varphi)$ for all values of $\theta_1$, $\theta_2$, $\varphi$.

*Positive Gain Constraint $G_r(\theta, \varphi) > 0$ for all values of $\theta$ and $\varphi$.

Therefore the process according to the invention consists of automatically recording C/No measurements over a long period, for example several days, using the receiver and an associated processing method, for example a computer.

Figure 7:
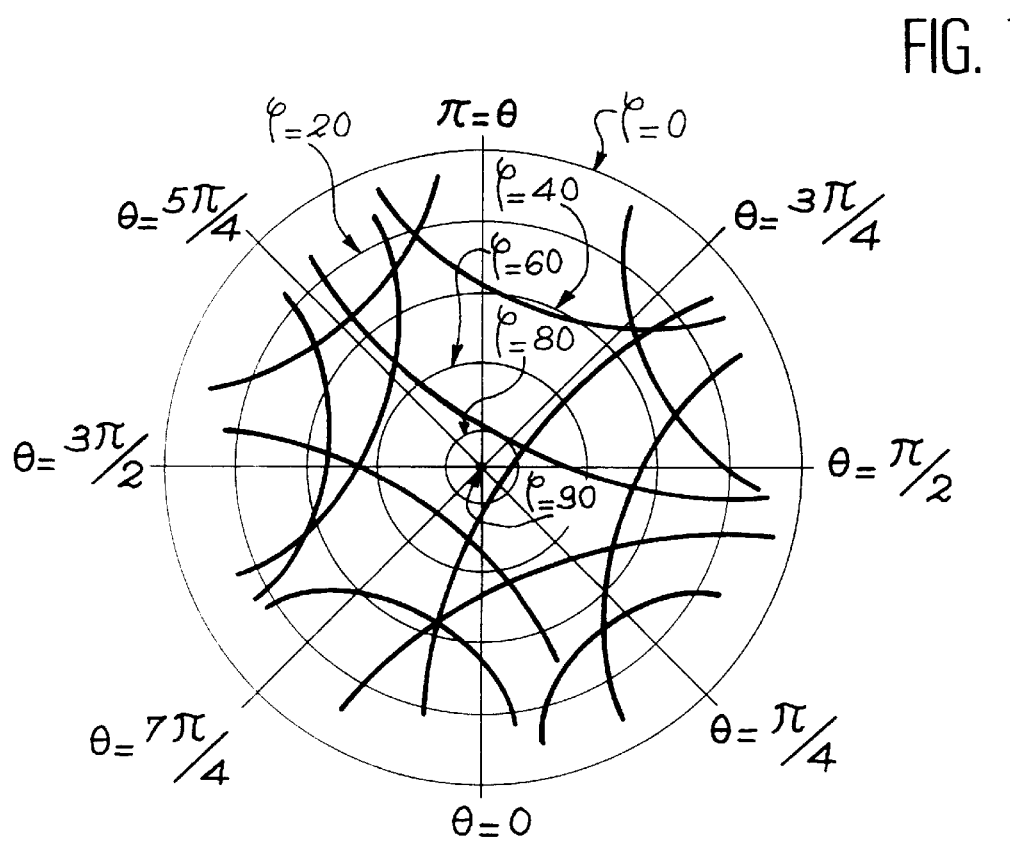
FIG. 7 illustrates the set of GPS satellite plots for a period of 24 hours.

In 24 hours, passes of the satellites in the constellation used will have the shape shown in FIG. 7. Note that plots of the satellites being tracked are fairly well distributed in all possible values for $\theta$ and $\varphi$. However, this distribution is not perfect. For a given antenna position, some ranges of values of $\theta$ and $\varphi$ are never reached by satellites in the constellation used, due to the geometry of their orbits.

The C/No curve corresponding to the satellite pass shown in FIG. 8, is shown in FIG. 9 as an example.

The duration of a complete plot like that shown in FIG. 9 usually takes a few hours (time for one pass of a radionavigation satellite).

Figure 10:
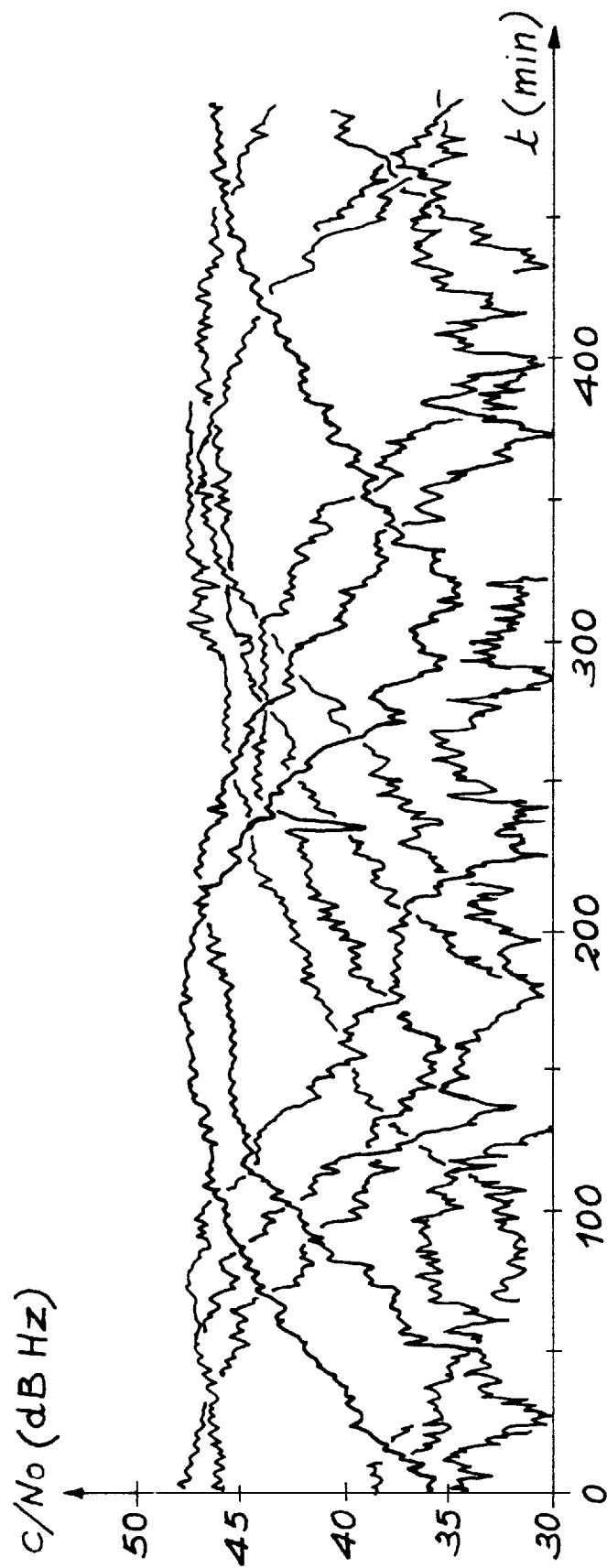
FIG. 10 represents real C/No measurement curves corresponding to passes of several GPS satellites.

FIG. 10 shows real C/no measurement curves corresponding to several GPS satellite passes.

The rate of C/No measurements can be programmed by the chosen receiver.

The gain estimating software may typically be a least squares type optimizer, for which the criterion and constraints are given in the appendix.

The estimated values for ai, bi, ci, di, ei and $P_{ek}$ are the values that minimize the residual energy, in the least squares sense of the term.

In one alternative embodiment, the constellations of GPS and GLONASS satellites are sized such that the same satellite is always located at the same "position" ($\theta$, $\varphi$) in the sky at the same time of the day, within a few minutes.

Therefore, it would be possible to imagine the use of an azimuth and possibly elevation positioner according to prior art, using this method:

in azimuth: the horizontal plate 40 on which the antenna to be tested can rotate by a perfectly known programmable angle $\theta_0$, as shown in FIG. 11;

in elevation: the plate 40 may be inclined by a programmable and perfectly known angle $\varphi_0$, as shown in FIG. 12.

Rotations of this assembly plate 40 used to support the antenna to be measured avoid the need to wait for too long before observing a significant change in the configuration of the satellite passes in the antenna coordinate system. Furthermore, this can minimize the lack of C/No measurements within some variation ranges of $\theta$ and $\varphi$, due to the geometry of the orbits of the satellites in the constellation used.

In one alternative of the invention, the antenna to be measured receives signals from geostationary satellites for which the orbital position, frequency and transmission gain are known. For example, the VHF, UHF, C, L, S and Ku reception bands can be used.

Therefore, the measurement principle described is applicable in this case, if the positioner described above is available.

In another alternative of the invention, it is possible to measure the diagram of an antenna for the reception of signals from constellations, in which the antenna is mounted on a satellite in orbit for which the attitude for the three axes is known perfectly.

Knowledge of this attitude can be used to determine the orientation of the antenna coordinate system for the antenna to be measured with respect to the observation directions of the satellites in the constellation used.

The problem with measuring the antenna diagram is therefore similar to the two previous cases. In this case, the antenna to be measured is connected to a constellation receiver onboard the carrier satellite.

Constellation signal receivers currently available can also observe detailed variations of the phase of received carriers (after spectrum despreading, when the signals used are transmitted in spread spectrum).

The phase of the received signal makes a skip equal to $\pi$ (3.14159 . . . radians) when the observability direction of the satellite being tracked changes from the main lobe of the antenna diagram to one of the secondary lobes of the said diagram.

The set of $(\theta_0, \phi_0)$ pairs associated with a phase change of $\pi$ therefore forms the boundary between the main lobe and the secondary lobes of the antenna. Knowledge of this boundary, in addition to the measurements of the C/No ratio, can be used to refine the estimate of the diagram for the antenna to be measured.

The equation of this boundary H will be measured using measurements of the $(\theta_0, 100_0)$ pairs associated with the phase change, using a least squares criterion.

This equation is denoted:

$$H(\theta_0, \phi_0) = 0$$

The estimate of the boundary equation is denoted:

$$\hat{H}(\theta_0, \phi_0) = 0.$$

The gain function of the antenna to be measured is assumed to be zero for all values of $\theta_0$ and $\phi_0$ satisfying this equation.

APPENDIX

Notation used

| | |
|---|---|
| j = | satellite number in the observed constellation, between 1 and j |
| n = | chronological order number of a measurement made by the constellation receiver |
| $N_{j\ min}$ = | order number of the first measurement made using satellite No. j |
| $N_{j\ max}$ = | order number of the last measurement made using satellite No. j |
| $\left(\dfrac{C}{No}\right)_{j,n}$ = | measurement of the C/No ratio made at time n using satellite No. j |
| k = | Boltzmann's constant $1.379 \cdot 10^{-23}$ W/K.Hz |
| L = | total losses (excluding free space losses) until the input to signal processing circuits in the constellation receiver |
| T = | noise system temperature of the receiver connected to the antenna |
| $f_L$ = | signal frequency used, broadcast by the constellation |
| c = | speed of light = $3 \cdot 10^8$ m/s |
| $D_j,n$ = | distance between the antenna and satellite No. j at time n |
| $PIRE_j$ = | intrinsic equivalent radiated power of satellite No. j |
| $\widehat{PIRE}_j$ = | estimate of the intrinsic equivalent radiated power of satellite No. j |
| $PIRE_{min}$ = | minimum possible value of PIRE for a satellite in the constellation |
| $PIRE_{max}$ = | maximum possible value of PIRE for a satellite in the constellation |
| $\phi_{j,n}$ = | sighting angle of satellite No. j, at time n, with respect to the main center line of the antenna diagram |
| $\phi_{max}$ = | maximum $\phi_{j,n}$ angle considered |
| $\theta j,n$ = | angle of the direction of sight in the antenna plane (defined by the x and y axes) of satellite No. j, at time n, with respect to the x axis |
| $Gr(\theta, \phi)$ = | gain function of the reception antenna defined in the x, y, z coordinate system |
| $\hat{G}r(\theta, \phi)$ = | estimate for the antenna gain function |
| i = | order of the coefficients for the antenna gain function |
| I = | maximum order of the coefficients of the gain function |
| f = | basic function for the antenna gain function |
| ai, bi, ci di, ei = | of order i coefficients for the gain function |

APPENDIX-continued

| | |
|---|---|
| ai, bi, ci, di, ei = | estimated order i coefficients for the gain function |
| A = | vector of required unknowns to determine the antenna gain and PIRE values |
| $\overline{A}$ = | solution vector containing parameters for the gain function and PIRE values |
| Mj,n = | value of the measurement function |
| $F(A; \theta_{j,n}; \phi_{j,n})$ = | function of gain × PIRE |

Useful equations

Link balance $$PIRE_j = P_{ej} \times G_{ej}$$

$$\left(\frac{C}{No}\right)_{j,n} = PIRE_j \times \frac{C^2}{(4\pi)^2 \cdot D_{j,n}^2 \cdot f_L^2} \times \hat{G}r(\theta_{j,n}; \phi_{j,n}) \times \frac{1}{k \cdot T \cdot L}$$

Gain function $$A = [PIRE_1, \ldots, PIRE_j, ao, \ldots, ai, bo, \ldots, bi, co, \ldots, ci, do, \ldots, di, eo, \ldots, ei]$$
$$\hat{A} = [\widehat{PIRE}_1, \ldots, \widehat{PIRE}_j, \hat{a}o, \ldots, \hat{a}i, \hat{b}o, \ldots, \hat{b}i, \hat{c}o, \ldots, \hat{c}i, \hat{d}o, \ldots, \hat{d}i, \hat{e}o, \ldots, \hat{e}i]$$

$$Gr(\theta, \phi) = \sum_{i=0}^{i=I} f(ai; bi; ci; di; ei; \theta; \phi)$$

$$\hat{G}r(\theta, \phi) = \sum_{i=0}^{i=I} f(\hat{a}i; \hat{b}i; \hat{c}i; \hat{d}i; \hat{e}i; \theta; \phi)$$

for example:

$$Gr(\theta, \phi) = \sum_{i=0}^{i=I} ai \cdot \cos(bi \cdot \theta + ci)\cos(di \cdot \phi + ei)$$

(the symmetry of revolution is imposed by choosing bi = 0) or:

$$Gr(\theta, \phi) = \sum_{i=0}^{i=I} ai\phi^i,$$

(in this case imposed symmetry of revolution) or $$Gr(\theta, \phi) = \sum_{i=0}^{i=I} ai[\cos(\phi + bi)]^{ci}$$

The gain function may also be broken down into Bessel functions.

Determination of the gain function $$M_{j,n} = \left(\frac{C}{No}\right)_{j,n} \times k \cdot T \cdot L \cdot f_L^2 \times \frac{(4\pi)^2 \times D_{j,n}^2}{c^2}$$

$$F(A; \theta_{j,n}; \phi_{j,n}) = Gr(\theta_{j,n}; \phi_{j,n}) \times PIRE_j$$

Least squares criterion $\hat{A} = A$ such that the sum of the squares of the residues $$\left[\sum_{j=1}^{j=J} \sum_{n=Njmin}^{n=Njmax} \{M_{j,n} - F(A; \theta_{j,n}; \phi_{j,n})\}^2\right] \text{ is minimized}$$

Constraints

* $PIRE_j \in [PIRE_{min}, PIRE_{max}]$
* $\phi_{j,n} \in [0, \theta_{max}]$

APPENDIX-continued

* $\theta_{j,n} \in [0, 2\pi]$
* $Gr(\theta, \phi) - Gr(\theta + \Delta\theta, \phi + \Delta\phi) \leq \Delta Gr(\Delta\theta, \Delta\phi)$ (continuity constraint)
$\Delta\theta$ and $\Delta\phi$: angular variation values
$\Delta Gr$: maximum tolerable gain variation, for angular variations $\Delta\theta$ and $\Delta\phi$.
* $Gr(\theta_1, \phi) = Gr(\theta_2, \phi)$ (symmetry of revolution constraint, optional) regardless of the values of $\theta_1$, $\theta_2$, and $\phi$
* $Gr(\theta_0, \phi_0) = 0$ for $(\theta_0, \phi_0)$ satisfying the equation $\hat{H}(\theta_0, \phi_0) = 0$ (constraint of the main lobe function, optional), where $\hat{H}$ is the estimate for the equation of the boundary for the main lobe.
*$Gr(\theta, \phi) \geq 0$ (positive gain constraint).
*$PIRE_i$ = fixed PIRE value.
This constraint, which consists of fixing the value of one of the required PIRE values, can eliminate the ambiguity between the said PIREs values and the gain along the center line of the reception antenna.

REFERENCES

[1] "Satellite Attitude From a Single GPS Antenna" by Y. Hashida and M. J Unwin (Proceedings of the Institute of Navigation (I.O.N) GPS 93 Technical Meeting, pages 355–363)

[2] "Using GPS to Determine the Attitude of a Spacecraft" by M. Martin-Neira and R. Lucas (March 1993, GPS world pages 49–54)

[3] "Use of Signal-To-Noise Ratio for Multipath Error Correction in GPS Differential Phase Measurements: Methodology and Experimental Results" by P. Axelrad, C. Comp and P. MacDoran (Proceedings of the Institute of Navigation (I.O.N) GPS 94, pages 655–666)

[4] "Markets Proliferating for Global Positioning Systems" by D. M. Graham (March 1990, "Sea Technology", pages 55–57)

[5] "Technical Description and Characteristics of Global Space Navigation System GLONASS-M" (International Telecommunication Union, Radiocommunication Study Groups, RTCA Papers, No. 50294/SC159-594

[6] "The GLONASS" by B. Panefieu (collection of transparencies used in a presentation made by the LRBA (Laboratoire de Recherche en Balistique en Aérodynamique—Aerodynamic Balistic Research Laboratory)

[7] "Accord de Standardisation; caractéristiques du système mondial de détermination de la position NAVSTAR (GPS)" (Standardization Agreement; characteristics of the world system for determining the NAVSTAR position) (NATO, STANAG 4294).

What is claimed is:

1. Process for diagramming an antenna radiation pattern comprising the steps of:

connecting an antenna to a receiver capable of supplying measurements of a C/No ratio, the C/No ratio being a ratio of useful signal power to noise power spectral density, and measurements of phase variation;

placing the antenna on a support, pointing the antenna to signal source satellites in a constellation and receiving signals generated by the satellites in a constellation;

wherein an antenna reception band is within a transmission band of the satellites;

receiving the signals generated by the satellites and automatically recording the measurements of C/No ratio and phase variation corresponding to the signals generated by the satellites for a fixed period; and calculating the antenna radiation pattern diagram of the antenna from the measurements of C/No ratio and phase variation.

2. Process according to claim 1, in which an antenna gain function is calculated by adjusting the measurements of C/No and phase variation using a least squares criterion.

3. Process according to claim 1, in which the satellites in a constellation are not geostationary.

4. Process according to claim 1, in which antenna gain is given by the formula $$G_r = \sum_{i=o}^{i=n} f_i(ai, bi, ci, di, ei, \theta, \varphi)$$

where $\theta$ and $\phi$ are spherical coordinates; ai, bi, ci, di and ei are coefficients.

5. Process according to claim 1, in which the antenna is an antenna in the L,S,C, VHF or UHF band.

6. Process according to claim 1, in which the satellites in a constellation are of the GPS, GLONASS, GLOBALSTAR, IRIDIUM or ORBCOMM type.

7. Device for measuring the radiation pattern diagram of an antenna comprising:

a support at the end of which an antenna to be measured is placed, the antenna being pointed to signal source satellites in a constellation, each satellite generating a signal;

a receiver connected to the antenna to process the signals from the satellites, the receiver having a signal processor capable of supplying measurements of a C/No ratio, the C/No ratio being a ratio of useful signal power to noise power spectral density corresponding to the signal from the satellites;

absorbent material placed on and around the support; and a calculating device which determines the antenna radiation pattern diagram of the antenna from the measurements of C/No ratio.

8. Device according to claim 7, in which the antenna is placed under a radome.

9. Device according to claim 7, comprising a preamplifier placed between the antenna and the receiver.

10. Device according to claim 7, comprising an azimuth and elevation positioner on which the antenna is placed.

* * * * *

UNITED STATES PATENT AND TRADEMARK OFFICE
CERTIFICATE OF CORRECTION

Page 1 of 2

PATENT NO. : 6,031,498
DATED : February 29, 2000
INVENTOR(S) : Issler

It is certified that error appears in the above-indentified patent and that said Letters Patent is hereby corrected as shown below:

Title page, item [56], References Cited, Other Publications Cited, Other Publications, line 9, delete "Seatle" and insert --Seattle--.

Column 2, line 58, delete "$\varphi$" and insert --$\phi$--.

Column 4, line 50, delete "$G_r$" and insert --Gr--.

Column 4, line 50, delete "$\varphi$" and insert --$\phi$--.

Column 4, line 53, delete "Gr" and insert --$G_r$--.

Column 5, line 15, delete "Gr" and insert --$G_r$--.

Column 5, line 49, after "Constraint" insert --:--.

UNITED STATES PATENT AND TRADEMARK OFFICE
CERTIFICATE OF CORRECTION

Page 2 of 2

PATENT NO. : 6,031,498
DATED : February 29, 2000
INVENTOR(S) : Issler

It is certified that error appears in the above-indentified patent and that said Letters Patent is hereby corrected as shown below:

Column 5, line 55, after "Constraint" insert --:--.

Column 5, line 57, after "Constraint" insert --:--.

Column 7, line 8, delete "$100_0$" and insert --$t_0$--.

Column 7, line 54, delete "$t_{max}=$" and insert --$t_{max}\cdot =$--.

Column 8, line 43, after "or" insert --:--.

Column 10, claim 4, line 3, delete "φ" and insert --$t$--.

Signed and Sealed this

Sixth Day of February, 2001

Attest:

Q. TODD DICKINSON

Attesting Officer

Director of Patents and Trademarks